United States Patent [19]

Baldi

[11] Patent Number: 4,880,483

[45] Date of Patent: Nov. 14, 1989

[54] PYROPHORIC COMPOSITION

[75] Inventor: Alfonso L. Baldi, Wynnewood, Pa.

[73] Assignee: Alloy Surfaces Company, Inc., Wilmington, Del.

[21] Appl. No.: 96,368

[22] Filed: Sep. 11, 1987

Related U.S. Application Data

[63] Continuation-in-part of Ser. No. 862,712, May 13, 1986, Ser. No. 857,939, Apr. 30, 1986, Ser. No. 849,533, Apr. 8, 1986, Ser. No. 830,767, Feb. 19, 1986, Pat. No. 4,799,979, Ser. No. 685,910, Dec. 27, 1984, Ser. No. 643,781, Jul. 17, 1984, Pat. No. 4,820,362, Ser. No. 559,334, Dec. 8, 1983, abandoned, Ser. No. 507,174, Jun. 23, 1983, Pat. No. 4,694,036, Ser. No. 479,211, Mar. 28, 1983, and Ser. No. 281,405, Jul. 8, 1981, Pat. No. 4,708,913.

[51] Int. Cl.⁴ .............................................. C06G 45/32
[52] U.S. Cl. .................................... 149/6; 149/3; 149/5; 149/15; 149/17; 149/18; 149/37; 149/44; 428/408
[58] Field of Search ................. 149/6, 3, 5, 15, 17, 149/37, 18, 44; 428/408

[56] References Cited

U.S. PATENT DOCUMENTS

| | | | |
|---|---|---|---|
| 3,959,041 | 5/1976 | Knapp | 149/2 |
| 4,349,612 | 9/1982 | Baldi | 149/15 |
| 4,508,580 | 4/1985 | Klöber | 149/19.91 |
| 4,756,778 | 7/1988 | Deitz et al. | 149/108.2 |

Primary Examiner—Stephen J. Lechert, Jr.
Attorney, Agent, or Firm—Connolly and Hutz

[57] ABSTRACT

Very good masking of pack diffusion aluminizing or chromizing on any metal to keep portions from being diffusion coated is effected by localized coating of masking powder, the metal portion of which can have some composition as substrates. Chromizing can be performed before aluminizing for greater effects. Aluminizing of metals like iron and nickel followed by leaching out much of the diffused-in aluminum gives these substrates a pyrophoric and catalytic surface. Foil, wire or powder can be thus activated; very fine activated powder when discharged into the air forms a warm cloud that settles very slowly and decoys heat-seeking missiles.

16 Claims, 3 Drawing Sheets

PYROPHORIC COMPOSITION

The present application is a continuation-in-part of application Ser. No. 862,712 filed May 13, 1986, Ser. No. 857,939 filed April 30, 1986, Ser. No. 849,533 filed April 8, 1986, Ser. No. 830,767 filed February 19, 1986 (U.S. Pat. No. 4,799,979 granted January 24, 1989), Ser. No. 685,910 filed December 27, 1984, Ser. No. 643,781 filed July 17, 1984, (U.S. Pat. No. 4,820,362 granted April 11, 1989) Ser. No. 559,334 filed December 8, 1983 (subsequently abandoned), Ser. No. 507,174 filed June 23, 1983, (U.S. Pat. No. 4,694,036 granted September 15, 1987) Ser. No. 479,211 filed March 28, 1983 and Ser. No. 281,405 filed July 8, 1981 (U.S. Pat. No. 4,708,913 granted November 24, 1987).

The foregoing are direct or chained continuations-in-part of the following still earlier applications:

| Serial No. | Filing Date | Status |
|---|---|---|
| 554,441 | Nov. 22, 1983 | Abandoned |
| 538,541 | Oct. 3, 1983 | Abandoned |
| 488,103 | April 25, 1983 | 4,615,920 |
| 417,214 | Sept. 13, 1982 | Abandoned |
| 416,353 | June 2, 1982 | Abandoned |
| 398,830 | July 16, 1982 | 4,467,016 |
| 311,621 | Oct. 15, 1981 | Abandoned |
| 310,085 | Oct. 9, 1981 | 4,617,202 |
| 302,979 | Sept. 17, 1981 | Abandoned |
| 299,789 | Sept. 4, 1981 | Abandoned |
| 242,350 | March 10, 1981 | 4,464,430 |
| 238,500 | Feb. 26, 1981 | 4,350,719 |
| 230,333 | Feb. 2, 1981 | 4,347,267 |
| 191,780 | Sept. 29, 1980 | Abandoned |
| 172,671 | July 28, 1980 | 4,435,481 |
| 98,654 | Nov. 29, 1979 | 4,290,391 |
| 89,949 | Oct. 31, 1979 | Abandoned |
| 73,539 | Sept. 7, 1979 | 4,260,654 |
| 71,741 | Aug. 30, 1979 | Abandoned |
| 53,762 | Oct. 23, 1978 | 4,241,147 |
| 25,456 | March 30, 1979 | 4,349,612 |
| 963,313 | Nov. 24, 1978 | Abandoned |
| 851,504 | Nov. 14, 1977 | Abandoned |
| 694,951 | June 11, 1976 | Abandoned |
| 614,834 | Sept. 19, 1975 | 4,141,760 |
| 446,473 | Feb. 27, 1974 | 3,958,046 |
| 404,665 | Oct. 9, 1973 | 3,948,689 |
| 357,616 | May 7, 1973 | 3,948,687 |

The present invention relates to the coating of metals and the use of the resulting products.

Among the objects of the present invention is the provision of novel coating techniques and compositions for use therewith, as well as novel uses for the coated products.

Additional objects of the present invention include compositions and techniques for improving diffusion coatings and for confining them to desired locations on workpieces.

The foregoing, as well as further objects of the present invention, will be more fully understood from the following description of several of its exemplifications, reference being made to the accompanying drawings in which.

Figure 1:
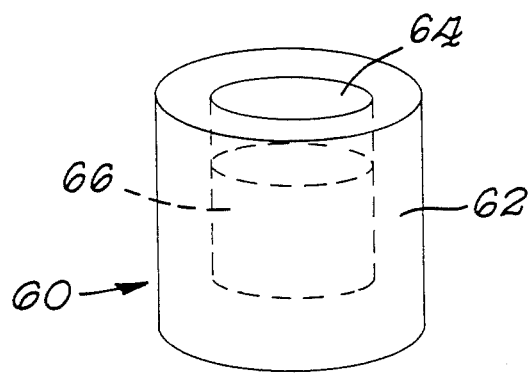
FIG. 1 illustrates a product representative of the present invention.

As pointed out in the earlier applications, diffusion aluminizing of ferrous metals greatly improves their corrosion resistance, particularly when top coatings are applied over the diffusion coating, and particularly for those ferrous surfaces containing at least 1% chromium. In some cases such diffusion aluminizing is best masked off from undesired portions of the surface of the workpiece being coated. Thus, where the dimensional accuracy of a workpiece is of a high order, such as on the root of a rotor blade that is to be securely received into a socket, it is frequently impractical to permit aluminizing of that root because the added aluminum increases the root's dimensions and renders the surface somewhat brittle.

Masking of diffusion coatings is readily accomplished by applying to the surface to be masked, a layer of powder having a composition similar to that of the substrate being coated. Thus, on ordinary irons and steels, as well as low-alloy steels, a localized layer of powdered iron appropriately diluted with inert diluent such as alumina can be applied to reduce or prevent diffusion coating under the layer. This layer can be covered by a sheath-forming layer as in the parent applications, but such covering is not needed where the workpieces are not roughly handled during treatment.

The diffusion coating of nickel or DS nickel with chromium or aluminum can be correspondingly masked by a masking layer of nickel powder, preferably containing about 20% to about 90% inert diluent to keep it from sintering to the surface being masked. Other substrates can likewise be masked by a powdered masking layer having the same or essentially the same composition as the substrate. Some substrate ingredients such as carbon, silicon, manganese and aluminum generally do not have to be present in such masking layer to minimize loss of those ingredients from the substrate during a diffusion heat.

It is generally awkward to make ferrous metal surfaces scrupulously clean. The awkwardness principally involves the formation of smut on the ferrous surface, particularly if it has been subjected to an electrolytic or acid treatment. The smut is probably the residue of some of the resistant constituents of the ferrous metal left behind when the surface of the metal is attacked. The best technique for removing the smut has been mechanical brushing. Because brushes so used tend to wear out fairly rapidly, the operation of fast-moving production cleaning lines that include brushing is difficult to make completely automatic.

According to another aspect of the present invention, the brushing off of the smut is replaced by the steps of depositing on the smutty surface a flash coating of nickel and then subjecting the thus-coated surface to the action of aqueous nitric acid containing a little halide such as $Cl^-$. This rapidly dissolves the nickel coating and also removes the smut. This is exemplified as follows:

EXAMPLE 1

A coil of two-mil thick SAE 1010 steel foil is passed through a series of tanks in which it is treated in the following sequence of steps, each talking about 1/6 minute:

(a) Alternating current (60 Hertz) electrolytic action as a bipolar electrode at 50 amperes per square foot in an aqueous solution containing 5% NaOH and 5% sodium silicate and held at 150° F.;

(b) Reciprocal bipolar electrode electrolytic action at the same current density and in the same bath as in step (a);

(c) Rinse in tap water;
(d) Dip into 1% by weight aqueous inhibited hydrochloric acid;
(e) Rinse in tap water;
(f) Passage through a nickel flash plating bath in which it is cathodically treated for three minutes at a current density of 20 amperes per square foot. The bath is an aqueous solution of 213 grams $NiCl_2 \cdot 6H_2O$ and 35 cc. 20% aqueous HCl, in 500 ml. water and is held at about 70° F. to 100° F.;
(g) Rinse in tap water;
(h) Dip into 20% by weight aqueous nitric acid containing 0.1% by weight hydrochloric acid; and
(i) Rinse in tap water.

After emerging from the final rinse, the foil is clean and no smut is detectable. It can now be loosely coiled as described in U.S. Pat. No. 3,222,212 for diffusion coating or given any other kind of coating.

The nickel flash can be deposited from acid or alkaline plating baths and need only weigh about 0.05 milligram per square centimeter. Greater coating weights do not help the smut removal significantly and coating weights over about 0.3 milligram per square centimeter generally take too long to apply and are too expensive. An electroless nickel flash can be used but it is not as effective.

The smut removal of the present invention can be effected on high-carbon steels as well as on alloy steels, including stainless steels and does a very good job on flat or curved surfaces. Surfaces that are too concave or convex should be plated with the help of anodes so shaped and located that a fairly uniform flash coat is deposited in order to make sure the flash is deposited all over the surface in the least time.

The nitric acid content of the flash-removing solution can range from about $\frac{1}{2}$% to about 40% by weight and should contain about 20 to about 200 times as much nitric acid as halide ion. While hydrogen chloride is a very convenient source of halide ion, any chloride, bromide, iodide or fluoride that dissolves and dissociates in the nitric acid solution, sodium or calcium chlorides, for instance, are suitable sources.

The de-smutting technique of the present invention is particularly desirable for use on surfaces that are not flat, or are not readily accessible for mechanical scrubbing. Thus, an expensive sand-blasting operation is eliminated in the preparation of AM 355 jet engine blades for diffusion aluminizing and top coating by the process described in U.S. Pat. Nos. 3,948,689 and 4,241,147. Such blades are very effectively given the following sequence of treatments.

EXAMPLE 2

The blades are subjected to steps (a), (b) and (c) of Example 4, followed by ultrasonic treatment at about 50,000 Hertz in tap water for one minute. They are then dipped into $\frac{1}{2}$% by weight aqueous uninhibited hydrochloric acid, followed by the flash coating of step (f) in Example 4, but with only thirty seconds of cathodic action at 40 amperes per square foot. This is then followed by another rinse in tap water and a strip in 15% by weight aqueous nitric acid containing 0.15% sodium chloride, another tap water rinse, a repeat of the foregoing ultrasonic treatment and another nickel flash coating. This flash coating is applied for two minutes at 40 amperes per square foot using the same nickel plating bath. The resulting flash-coated blade is rinsed in tap water, permitted to dry and packed in the aluminum diffusion coating pack of Example 1 in U.S. Pat. No. 4,241,147 and then to the diffusion coating there described. After the aluminizing, the blades are removed from the pack, washed with tap water and given the top coating of Example II of U.S. Pat. No. 3,948,689.

The resulting blade has a very smooth surface and a long life in a jet engine compressor.

The nitric acid strip solution should not be kept in contact with the ferrous surface for more than a few seconds after the flash is removed. While nitric acid tends to passivate ferrous surfaces, particularly when this acid is in a high concentration, the passivating action cannot be depended upon to persist very long when the metal is being manipulated.

Masking of chromium-nickel-iron type stainless steels during chromizing is best effected by imbedding in compacted powder the metallic portion of which is 13 to 20 weight % chromium, 6 to 10 weight % nickel, and the balance iron, and is diluted with 1 to 2 parts by weight of $Al_2O_3$. The powder is broken in by a pre-firing. When the chromium content of the metallic portion is above about 17 weight percent, a slight chromizing can be effected right through a layer of masking powder as much as two inches thick. Such chromizing is not necessarily undesirable inasmuch as it assures that chromium has not been depleted from the substrate being masked. By avoiding depletion, the masked surface remains ductile, strong and with a somewhat enhanced corrosion resistance.

Where embedment is impractical for the masking, then masking layers can be applied from slurries in volatile solvents as described above. However a $\frac{1}{8}$ inch layer so applied is not suitable by itself and is not compact enough to prevent major chromizing. Application over such a coating, of a second layer containing a major amount of iron powder with or without refractory diluent will effectively prevent passage of chromizing vapor to the substrate and also forms a protective sheath. A small content of chromium, about 5 weight % of the total metal content can be added to the second layer, to help assure that there is no excessive depletion of chromium from the first layer and from the substrate.

As pointed out in U.S. Pat. Nos. 3,248,251 and 4,537,632, as well as in some of the parent applications, metals can be protected against corrosion, particularly when used in jet engines, by a coating mixture of chromic acid, phosphoric acid and magnesium salts of those acids. Such mixtures are readily applied as a water solution in which there can be suspended finely divided particles of granular, spheroidal or leaf aluminum or the like. Dispersing or wetting agents can also be added to such solution or suspension to improve its wetting action.

The foregoing is discussed in the disclosure of parent Ser. No. 849,533. As there described, a ferrous metal member such as in the compressor section of a jet or gas turbine engine is very effectively protected against attack and has its surface smoothed by a coating combination of a layer of baked and machine-burnished aluminum-particle containing mixture weighing between about 0.1 and 0.5 milligrams per square centimeter, of phosphoric and chromic acids and their magnesium, aluminum, calcium or zinc salts, which mixture has about 0.2 to about 1 mol of chromate ion and about 0.7 to about 4 mols of phosphate ion for every 0.4 to 1.7 mols of magnesium ion. At least 0.2% of the aluminum particles are in leafing form; at least 90% being in granular form and the leafing aluminum being essentially uniformly dispersed into the coating.

Aluminum particles below 5 microns in size are preferred, and below 3 microns in size particularly preferred. Aluminum-silicon alloys containing about ½% to about 20% silicon by weight are also preferred.

Mixing with the aluminum particles about 1% to about 10% magnesium powder by weight provides even better protection. Increasing the baking temperatures or the final baking temperature when more than one coating is applied, as for example to 450° C. or higher, also increases the degree of protection whether or not magnesium is present in the top layer, but temperatures above about 650° C. to 700° C. can adversely affect some ferrous metals.

Best results are obtained with ferrous metals containing at least 1% chromium and stainless steels, such as martensitic or age-hardenable steels generally used for jet engine compressor section parts, are ideally suited for protection by the above-described coating combinations. Such combinations are described in U.S. Pat. No. 4,141,760.

Although the magnesium salts in the aqueous phosphoric acid-chromic acid mixture can be partly or completely replaced by the corresponding salts of aluminum, calcium or zinc without material loss of protective effects in some high-temperature uses in aircraft engines, zinc as well as zinc compounds of any kind are frowned upon.

The presence in the aqueous coating mixture of a small amount of polytetrafluoroethylene resin particles as described in some of the parent applications is helpful, but is not needed in layers that are covered by further coatings.

As shown in the parent applications, a small amount of colloidal alumina or colloidal silica can be applied before the coatings of the present invention. Such colloidal particles do help provide smoother coatings. In some cases such as in the coating of closely spaced turbine airfoils, maximum smoothness is desired.

As also pointed out in the earlier applications, a preliminary diffusion aluminizing of the ferrous metals greatly improves the corrosion resistance provided by the foregoing top coatings, particularly for those ferrous surfaces containing at least 1% chromium. In some cases, such diffusion aluminizing is best masked off from undesired portions of the surface of the workpiece being coated. Aluminum diffusion into some jet engine compressor parts is conducted at temperatures as low as 900° F. or even slightly lower, whether or not it is partially masked.

Also, after one or more layers of coatings containing granular aluminum, it is helpful to apply one or more overlying layers in which all their aluminum is in leafing or flake form.

The acid chromate-phosphate coating is quite deliquescent when it is dried somewhat and exposed to air having a relative humidity of about 50% or more. The presence of dissolved magnesium or other salts in the coating solution does not significantly diminish the deliquescence, and neither does the presence of suspended particles of aluminum or other substances, whether that aluminum is in the form of flakes, granules or spheroids.

The deliquescence can be eliminated by slowly drying the applied coating mixture at about 95° C. to 130° C. About one hour's drying time in an air oven set in that temperature range is quite effective for coatings that are no more than about 3 mils thick after drying. Thicker coatings are generally not used but may call for increasing the drying time to 1½ hours. The dried product can then be given the bakes and burnishing treatments usually applied. Infra-red heating is also very satisfactory, particularly for substrates that are too awkward to heat in an air oven.

The parent applications refer to the preparation of active metal surfaces by diffusion coating a metal such as nickel, platinum, iron or the like, and then dissolving out the material introduced by the diffusion.

Palladium is best catalytically activated with zinc. A simple diffusion of about 1 to 30 milligrams of zinc per square centimeter of palladium surface, followed by leaching with strong, at least 10%, HCl in water at 95° C., produces from a one-mil thick foil a very effective catalyst. A typical pack diffusion treatment for palladium is the embedding of a 52-mesh palladium screen the wires of which are 4 mils thick, in a pack of 20% powdered zinc and 80% alumina, energized with ½% NH$_4$Cl, and heating for four hours at 600° F. in a hydrogen-bathed atmosphere. This effects a zinc pick-up of 4 mg/cm$^2$, essentially all of which is leached out by 20% HCl in ten minutes. The resulting screen is pyrophoric when exposed to air.

Zinc can be similarly diffused into titanium foil in a hydrogen-bathed atmosphere from such a zinc-containing pack. As an example, a 4-mil thick titanium foil is embedded into a pack having the following composition:

| | |
|---|---|
| Zn | 80 g. |
| Al | 16 g. |
| Al$_2$O$_3$ | 305 g. |
| AlCl$_3$ | 4 g. | and subject to ten hours of diffusion at 950° F. to 1000° F. The foil picks up about 3.5 milligrams of zinc per square centimeter. It is worthy of note that the titanium does not become seriously embrittled by such treatment and can be bent around a ⅛-inch radius without cracking. The diffused-in zinc can be leached out with 20% boiling NaOH solution to leave a very active catalytic surface. Titanium activated this way can be used as a conventional electrolysis electrode or as a substrate for the photo-sensitive electrodes described in the Augustynski et al. paper in the *Journal of the Electrochemical Society*, Volume 124, No. 7, pages 1063–1064 (1977).

For some purposes, such as catalytic alkylation, it is helpful to have a catalytic tin surface. Inasmuch as tin is a very low-melting metal, it is helpful to first diffuse the tin into a high-melting support such as nickel. By way of example an 80-mesh nickel gauze made of 4-mil thick wire is embedded into the following pack:

| | |
|---|---|
| Tin powder | 73 g. |
| Nickel powder | 27 g. |
| Alumina | 300 g. |
| NH$_4$Cl | 4 g. | which pack had been pre-fired at 1000° F. for five hours and then had its NH$_4$Cl content replenished. Diffusion is conducted in hydrogen at 1400° F. for five hours to give a 20 milligram per square centimeter pick-up. The resulting tin-containing gauze after removal from the pack is subjected to post diffusion by heating in hydrogen at 1600° F. to 1700° F. for five hours to leave the diffusion case about 1.3 mils thick. This product is now activated by a pack diffusion at 850° F. to 900° F. for thirty hours using a pack having 20% powdered aluminum, 80% powdered alumina and energized with ½% anhydrous aluminum chloride. The aluminized product is then subjected to leaching with 10% NaOH solution to extract most of the diffused-in aluminum and leave an activated tin-nickel surface.

An activated copper-palladium surface can be prepared as by first electroplating a 1-mil thick layer of copper on a 1-mil thick palladium foil, heating the copper-palladium combination in hydrogen at 1050° F. to 1100° F. for twelve hours to diffuse the copper deeply into the palladium and then diffusion coating the resulting product under hydrogen in a pack containing 10% zinc, 90% alumina and activated with ½% $NH_4Cl$. Ten hours of such treatment at 660° F. to 690° F. produces a pick-up of about 7 milligrams of zinc per square centimeter of foil surface and a 0.7 mil thick case, the surface stratum of which contains about 25% zinc. The final step in the activation is a leaching in 30% HCl for three minutes at about room temperature followed by ten minutes more at about 212° F. in 15% HCl.

The pack diffusion to activate the catalyst can be effected in one step or in multiple diffusion steps under different diffusion conditions to vary the distribution of the diffused-in metal. Regardless of how the diffusion is carried out, the catalytic activity of the leached product can be entirely blocked by immersing the activated surface in an aqueous solution of a chromate such as an alkali metal, magnesium or ammonium chromate or chromic acid. A concentration of about 1% chromate ion is all that is needed to inhibit essentially all the catalytic activity of nickel or platinum, for example, after only a few seconds contact. Smaller concentrations, as low as 0.1% chromate ion, will also be effective if kept in contact for longer times.

A catalyst so inhibited can be conveniently stored or shipped without being immersed into a protective liquid. Moreover, the catalyst can be subsequently reactivated by merely treating it for about two minutes with 5% aqueous NaOH, preferably at 90° C. Rinsing away this treating liquid will then leave the catalyst with almost all of its original activity.

A readily ignited metal such as zirconium, titanium or magnesium in foil or wire form can also be given a nickel coating, as by rolling, and the nickel coating then rendered pyrophoric. To ignite the ignitable metal, the coating should be at least about 0.4 mil thick and the foil or wire not over about 20 mils thick.

The pyrophoric metals, regardless of how they are produced, can be plated as by electrolytic coatings from alkaline cyanide baths of zinc, cadmium, silver, tin or copper without significantly diminishing their pyrophoricity unless the coatings are over about 0.2 mil thick.

Techniques for preparing and using pyrophoric metals are described in parent Application Ser. No. 281,405. The contents of that application are hereby incorporated herein as though fully set forth. As there noted, powdered materials can take other forms. Thus, a 5-mil thick felt of boron or carbon fibers or ordinary paper or cotton cloth can be coated on one or both sides with a paste of pyrophorically activated iron or nickel powder, and the coated felt subjected to a drying and if desired, a sintering treatment to form a self-supporting sheet in which the pyrophoric particles are embedded into the inter-fiber spaces. A boron fiber felt weighing about 0.1 gram per square centimeter of gross surface (as measured with a ruler), carrying 0.2 gram pyrophoric iron powder per square centimeter of gross surface, generates a very large amount of heat when exposed to the atmosphere. Ordinary steel wool also makes a very effective porous substrate for impregnation.

Carbon fiber fabrics are difficult to ignite when they have not been pre-activated as by impregnation with lead or copper acetate, or by a decarburizing etch. Only about 15% pyrophoric iron or nickel powder by weight of the carbon fiber fabric is generally enough to ignite the activated fabric, but at least about 20% is needed for the unactivated fabric.

The activated iron powder is readily prepared by aluminizing an iron foil completely through its thickness, grinding the aluminized foil to a powder, and then leaching the powder with aqueous NaOH. Raney iron can also be used. Activated nickel powder can be prepared the same way, but it is preferred to use Raney nickel powder or to leach powdered $NiAl_3$ with alkali.

Instead of making a pyrophoric combination by starting with a sheet of felted fibers, the starting material can be a porous sheet or disc prepared as by a sintering operation so as to contain at least about 20% voids. The voids are then impregnated with pyrophoric or combustible particles as by merely applying to the sintered sheet or disc a slurry of the particles suspended into water or other volatile liquid. The presence of 1% to 5% resin binder in the liquid based on the weight of the suspended particles helps retain them in place after they are impregnated into the pores. Such particles are preferably about 1 mil or less in thickness and the pores are at least about three times the particles' size. The porous sheet or disc can thus be sintered from particles at least about 10 mils in diameter so as to contain such large voids.

Alternatively, the pyrophorically activated particles can be mixed with the non-pyrophoric combustible particles and the mixture thus sintered into the desired finished structure. In this modification, powdered 100-mesh magnesium is, for example, mixed with one-half to twice its weight of minus 180-mesh pyrophoric iron or nickel powder, and the mixture first compacted under argon at 10,000 pounds per square inch into a disc about 5 mils thick and then sintered at about 600° C. Only about thirty minutes at that temperature is sufficient. Higher temperatures can be used with other materials, but may cause excessive thermal deterioration of the pyrophoric particles and should be limited to shorter times.

Other particles such as of boron, zirconium and the like can be included in the mixture being sintered, even though these other particles do not significantly sinter together under the sintering conditions, so long as they are not in such large proportions as to prevent the sintering of the sinterable particles. For the greatest thermal output, a high boron content is desired, at least 20% by weight, and some easily ignited metal such as magnesium, titanium or zirconium can be used to be more readily ignited by the pyrophoric particles. Because the non-pyrophoric particles act as heat sinks, the content of pyrophoric particles should be at least ⅓ by weight in order to reach the necessary ignition temperature, at least in one portion of the sintered member. Pyrophoric nickel particles are somewhat more effective than pyrophoric iron particles in igniting non-pyrophoric particles.

The compacted and/or sintered mixtures can be made using pyrophoricity-developing particles that are not leached until the compacting and/or sintering is completed, but the products produced this way are less effective.

The magnesium-containing mixtures of the present invention, particularly the iron-magnesium-containing mixtures, may be used for the purposes described in U.S. Pat. No. 4,264,362.

Pyrophoric particles can also be obtained by leaching alloy particles prepared by diffusion coating as in Canadian Pat. No. 603,191 or alloying iron or nickel powder or other similar powders. Thus, iron or nickel or cobalt powder is readily diffusion aluminized in a diffusion coating retort in which such powder and aluminum powder are heated to diffusion coating temperature, preferably in contact with a vaporized diffusion coating activator. This is illustrated in the following example:

EXAMPLE 3

40 grams minus 325 mesh iron powder are mixed with 60 grams similarly sized aluminum powder and 1 gram anhydrous aluminum chloride powder, and the mixture placed in a steel retort, the retort loosely covered and placed in a larger retort through which a stream of argon flushes. The retort assembly is then inserted in a furnace, heated to 1200° F. and kept there for 1½ hours. During the initial heat-up, a stream of hydrogen is substituted for the stream of argon. After cooldown the powder particles have sintered together to a large degree, and the resulting masses are ground, as with a chopper blade such as used in a micro-mill type grinder, to very fine particle size, for example 325 mesh. These particles can be screened out, if desired and constitute particles that can be somewhat larger in size than the original particles. These aluminized particles can now be subjected to a caustic leach treatment to produce highly pyrophoric iron powder the particles of which are about the same overall size as the aluminized particles. The grinding can be controlled to provide activated particles of larger or smaller size.

To reduce the tendency for the particles to sinter together during the diffusion coating, the diffusion temperature and/or time can be lowered to as low as about 800° F. to 900° F. and/or inert refractory particles such alumina powder can be mixed with the iron and aluminum powders. After such a mixture has completed its diffusion coating treatment or the leaching treatment, the inert alumina can be separated out magnetically. The leached iron particles are magnetic whereas the alumina particles are non-magnetic so that pouring a stream of the mixtures through a magnetic field causes the iron particles to be deflected away from the alumina particles. There may be some tendency for fine alumina or other refractory particles to physically adhere to the diffusion-coated iron particles, in which event the diffusion-coated mixture can be forcefully agitated in water preferably containing a little surface active agent to wash the fine alumina or the like off the heavier iron particles and permit those heavier particles to settle out.

Powdered pyrophoric metal or powdered precursor alloys can also be separated from inert diluents or other ingredients in diffusion coating packs by having different sizes for the particles to be separated and sieving the mixture to effect the separation. Thus cobalt balls at least about 20 mils in diameter can be diffusion coated in a pack whose particles are all smaller than 2 mils thick. Such diffusion coating can be for purposes other than the preparation of pyrophoric articles, and is suitable for chromizing, tantalizing, boronizing, nickelizing etc. Cobalt balls that are first chromized and then aluminized by powder packs as described in column 3 U.S. Pat. No. 4,041,196, are highly suited for the flue treatment described in U.S. Pat. No. 4,254,616.

When substantial quantities of iron and aluminum powders are mixed and heated, they react with each other as the temperature reaches about 900° F., and generate large quantities of heat while very rapidly forming the aluminide. Thus for continuous formation of aluminide powders, iron or nickel powders or mixtures of the two can be further mixed with the aluminum powder and then poured onto a moving conveyor of Inconel 600 for example that carries the resulting mixture through an aluminizing atmosphere where the leading edge of the mixture is heated as by a burner or oven to initiate the reaction. When the reaction starts the burner can be turned off, and when an oven is used the oven can be temperature-controlled to reduce or cut off the heat it supplies, at the time the reaction supplies sufficient heat.

Where the case to be formed by the diffusion coating is very thin, the diffusion coating pack can contain only enough coating metal to form the desired case thickness, so that the coating metal is entirely or substantially entirely depleted by the time the diffusion coating step is completed. This makes it a little easier to effect the separation of the coated substrate particles.

The substrate particles can also have a substantially higher density than the pack particles so that the final separation of coated substrate is by density difference, such as by stratification with a liquid of intermediate density or by causing a stream of the pack powder, after the coating completion, to fall through a transversely blowing stream of air. The transversely moving air carries the less dense particles to one side much further than the denser particles. Such a separating technique is particularly desirable with low temperature aluminizing, because the aluminum powder then remaining in the coating pack has a density much lower than most substrate metals.

The ignition temperatures referred to above are the lowest temperatures at which the metals there discussed ignite in air. Pyrophoric metals react and ignite at extremely low temperatures and are accordingly not considered as having an ignition temperature. When an ignition temperature is mentioned, it is accordingly in connection with a material that is not pyrophoric. Carbon and boron, both of which are ignited by the pyrophoric metals, can be considered ignitable metals for the above purposes.

Finely divided pyrophoric nickel can be prepared by substituting nickel powder for the iron powder of Example 3.

The treatments described above for increasing or tempering the pyrophoric effects of pyrophorically-activated surfaces are applicable to those surfaces whether they are activated or treated by a continuous process or by a batch process. Examples of some desirable batch processes include the open-coil treatment described in U.S. Pat. No. 4,349,612.

The pyrophoric surfaces of the present invention are also catalytic, and this catalytic characteristic is not destroyed if the pyrophoricity is diminished or even completely eliminated. Thus treatment of these pyrophoric surfaces with 3% aqueous $H_2O_2$ will eliminate all pyrophoricity but the resulting surfaces are still highly catalytic. Indeed such catalytic function is particularly desirable for use under conditions in which they are subjected to a reducing rather than oxidizing environment. Nickel cathode electrodes prepared that way are thus very long-lived over-voltage diminishers, and platinum or platinum-5% rhodium screens are long-lived high temperature catalysts for HCN synthesis. It appears that some activating metal such as aluminum is still present in these catalytic surfaces and at high temperature conditions this residual metal causes changes that alter the catalytic nature. Vigorous anodic treatment in aqueous caustic removes much of this residual metal.

The pyrophoric particles as well as the pyrophoric foils, can be used to generate a hot cloud, as for example to decoy heat-seeking missiles. Thus the pyrophoric particles produced according to Example 6 can be rinsed with water then with acetone and packed under argon in a simple container or in a spray can, and about 100 grams of such powder projected into the air. These particles promptly heat up and oxidize. The resulting cloud of particles rises as a result of the heating. It is only after several minutes that the oxidized particles settle down to the ground.

The pyrophoric particles are conveniently discharged to form the desired cloud, by loading them into a shotgun shell in place of the shot and the shot-dispersing gunpowder. A relatively short 12-gauge paper shell can thus be packed with about 50 grams of the powder sealed airtight in a plastic enclosure around which the shell is crimped. The usual primer charge will be enough, when detonated, to expel the powder and create the desired cloud.

Larger quantities, up to a pound or more, can be poured into a valved pressure-resistant container which is then pressurized to about 200 to 600 pounds per square inch gauge with argon. Upon opening the valve, the powder contents are propelled out with the argon.

Where the activated metal is to be used in the form of small pieces of foil, these pieces are desirably made by processing an open coil of iron or nickel, for instance, through an activation sequence including diffusion aluminizing followed by leaching, after which the still unwound activated coil is sliced through as by diametrically oriented saw blades or diamond-coated cutting discs or laser beams. Thus, an activated open coil made as described in U.S. Pat. No. 4,443,557 and having an internal diameter of seven centimeters with an outer diameter of twelve centimeters, the activated foil being about 1/20 millimeter thick, is readily sliced into eight or more segments. Where saws or other mechanical cutters are used, they should be cutting at high speed (i.e., over 30 meters per second) in view of the fragile nature of the thin metal being cut.

Also the coil can be held between spaced radially oriented grippers while the cutting takes place to keep its segments in place until the cutting is completed.

The foregoing technique provides individually cut pieces of activated foil as small as two centimeters or less in the coil-winding direction. To reduce the variation in length between the pieces from the inside of the coil as against those from the outside of the coil, the coil's inner turns can be expanded so as to take up the slack between turns.

A hot cloud of rising particles is also produced with pyrophoric iron-aluminum alloy particles obtained by leaching powdered $FeAl_2$ or $FeAl_3$, both of which are available commercially as powdered Raney metal. Such commercial powders are obtained by grinding a solidified melt of iron and aluminum having these metals in the desired porportions. Powders with particles sized to pass 100 or 250 mesh are thus available. If desired, they can be ground down to particle size of less than 60 microns or even less than 30 microns. Particles as small as 2 to 3 microns tend to become passivated and are not very desirable; particles from about 5 to about 10 microns in size are quite suitable.

Modifying Example 3 by using particle size of about 30 to 100 microns for the iron powder and for the aluminum powder and reducing the diffusion time to one hour after it reaches 900° F., yields iron-aluminum alloy particles not heavily sintered together; a light crushing in a mortar and pestle yields a powder that can be somewhat coarser. A one-hour leaching of that powder in 17% aqueous NaOH by weight while keeping the leaching temperature no higher than 110° F. leaves a pyrophoric powder that when discharged produces a hot cloud that does not rise much before eventually settling out.

An alloy in which before leaching the aluminum content is at least about 40% by weight should be used to make the desired cloud, but an aluminum content of at least about 50% by weight is preferred. The addition to the caustic of stannite or stannate to the leaching caustic, as described in U.S. Pat. No. 4,435,481 is desirable.

Pyrophoricity is readily measured by exposing a 25 to 35 milligram sample of the activated powder to air and using a two-mil platinum-platinum/rhodium wire thermocouple to measure the temperature rise during the exposure. A temperature of 600° F. should be reached, but preferred temperatures are as high as 1100° F. or higher.

Substituting nickel for the iron in the diffusion coated particles, or using commercial Raney nickel powder, gives somewhat better results in producing a rising cloud of pyrophorically heated particles. Thus, nickel-aluminum alloys containing as little as about 35% aluminum before leaching can be very effectively used.

Where, before leaching, the pyrophoric particles are made by diffusing aluminum into iron or nickel, it is important to conduct the diffusing operation at relatively low temperatures, such as below 1200° F. and preferably below 1000° F. Even at temperatures as low as 850° F. the time at temperature can be as short as about 45 minutes when a diffusion activator such as $AlCl_3$ is used.

The alloy particles can also contain other ingredients such as boron, titanium, carbon, zirconium and magnesium that help generate heat. Excluding the aluminum, the content of pyrophoric metal in the leached alloy should be at least about half by weight in order to have enough pyrophoricity to cause the remaining ingredients to react and generate their reaction heat.

The pyrophoric reaction can be stretched out by interfering with the access of oxygen to the pyrophoric surface. Thus, light coatings of colloidal silica or alumina as described in U.S. Pat. No. 4,349,612 can be applied to the particles. Also, leaching in caustic that contains sodium or potassium silicate leaves a residual silicate film if rinsing is incomplete or by rinsing thoroughly and then dipping into a dilute solution of silicate preferably having a 3-to-5 $SiO_2$ to 1 $Na_2O$ ratio.

The pyrophoric particles used to make the hot cloud can be mixed with other materials that increase or decrease the heat generation and/or vertical cloud movement. Thus the activity of the pyrophoric particles can be reduced as by too vigorous leaching or by particularly light leaching, and the sizes of the pyrophoric particles can be increased to 100 or more microns to keep them from rising much in the hot cloud. Alloying the particles with other ingredients such as silicon or chromium that are not rendered pyrophoric, also reduces the upward movement of the cloud they generate after activation.

Alternatively the pyrophoric particles can be mixed with non-pyrophoric particles such as unactivated iron powder or carbon powder which act as diluents and also burn.

On the other hand the pyrophoric particles can be packed wet with a volatile combustible liquid like n-heptane which quickly evaporates when the particle pack is discharged, and is then ignited when the dried particles pyrophorically heat up. Other materials such as strong aqueous solutions of ammonium nitrite inflame when in contact with the cloud-forming particles, and particles wet with such solutions will immediately react with the air even before the solution solvent evaporates. Such ammonium nitrite solutions should have a concentration of at least about 5% by weight, preferably at least about 10% by weight, and should not be in contact with the pyrophoric particles for more than about 5 minutes, preferably no more than about 2 minutes, before the particles are discharged into the air.

A particularly desirable use for pyrophoric particles is to ignite thermite type mixtures to thus generate very high levels of heat energy. Thus a 15-gram mixture of, by weight,

EXAMPLE 4

| | |
|---|---|
| 1 part | pyrophoric iron powder |
| 2 parts | zirconium powder |
| 3 parts | ferric oxide powder | all powders being about 325 mesh in size will spontaneously ignite when exposed to air and generate sufficient heat to melt through a 30 mil thick 1010 steel sheet on which the mixture is held.

Similar results are obtained when aluminum powder is substituted for some or all of the zirconium powder, $Fe_3O_4$ is substituted for some or all of the ferric oxide, and pyrophoric nickel powder substituted for some or all of the pyrophoric iron. The content of pyrophoric powder can range from about 15% to about 30% of the mixture, by weight, and the proportion of thermite metal oxide oxidizer to thermite metal reducer should be close to stoichiometric as in any thermite mixture.

The self-igniting thermite mixture can be further mixed with a binder such as an acrylic resin that is dissolved in a readily vaporizable solvent like acetone or methylethyl ketone. Such a wet combination can then be painted on a carrier or impregnated into a porous carrier on which the self-igniting solids are to be applied. A typical wet mixture of this type is, by weight,

EXAMPLE 5

15.4% pyrophoric iron powder 30.8% zirconium powder 30.7% $Fe_2O_3$ 23.1% of a 0.5% of solution of polyethylacrylate in acetone.

Such a wet composition is also simpler to store than a dry composition since when held in a container the liquid helps keep the pyrophoric powder out of contact with air.

No resin or other binder is needed in the composition, but helps hold active powder mixture in place. The content of binder, when present, should not be over about 1% by weight of the total solids, so as not to seriously block their access to the air. Other resins such as polyvinyl chloride, cellulose nitrate and polysytrene and other solvents such as nonane, can be used.

For even greater heat output, the pyrophoric thermite mixture can be used to ignite a thermite mixture that is not diluted by a pyrophoric ingredient. More concentrated heat generation can be obtained by compacting the thermite mixture as by pressing the mixture into compact discs, each about 1¼ inches in diameter and about ¼ inch thick. A compacting pressure of about 300 to about 20,000 pounds per square inch is generally effective, and even about half that much where the powder is wet with binder solution.

Such compacted mixtures are more difficult to ignite than uncompacted powders. Thus, a compacted disc of Al—Ni—$Fe_2O_3$, Zr—$Fe_2O_3$ or Al—$Fe_2O_3$ thermite will not be ignited by one-fifth its weight of pyrophoric powder mixture of Example 4 that is poured onto the disc. The pyrophoric mixture merely goes through its pyrophoric reaction with air and then cools off without setting off the disc. On the other hand, a quantity of loose Zr—$Fe_2O_3$ thermite mixture will be ignited by pouring one-fifth of its weight of the Example 4 composition onto an edge.

A compacted thermite disc is readily ignited by placing it in a porous holder such as a pocket cut out in a polyurethane sponge, and impregnating the sponge with the composition of Example 8. This is illustrated by a cylindrical assembly 60 of FIG. 2. That assembly has an external cylindrical shell 62 of polyurethane sponge, in which a pocket 64 is cut through most of its depth. Within that pocket is fitted a compacted thermite disc 66 of a mixture by weight of 19.6% aluminum, 21.5% nickel and 58.9% $Fe_2O_3$.

For the very maximum of heat output, thermite compositions containing mixtures of aluminum and nickel reducers are used. About ¼ to about ½ of such mixtures are preferably aluminum, although any mixtures of these two metals are effective.

Before the disc is inserted into the pocket, the pocketed sponge is impregnated with the composition of Example 8. A disc weighing 29 grams used with a quantity of impregnant weighing about 39 grams, makes a very effective combination when a sponge so fitted is exposed to air. Reducing the quantity of impregnant to 8 grams will still give good ignition of the thermite disc.

There is no need to cover the top of pocket 64. The wall of the sponge around the pocket can be as little as ⅛ inch or as much as ⅜ inch thick or even more. Also, the sponge can be of rectangular rather than cylindrical configuration so that a number of such sponges can be more compactly packed together into a container. A single sponge as illustrated will ignite, reach temperatures well above 1500° C. and take over eight seconds from the time it reaches 1300° C. in the heat-up, until the time it cools down to 1300° C. Its dwell over 300° C. is well over 20 seconds. It gets so hot that it melts a hole through a 60-mil thick 1010 steel sheet on which the loaded sponge is placed. Such melt-through also takes place when the disc 66 is replaced by an uncompacted mixture of the same powder.

Such a loaded sponge makes a highly desirable decoy for heat-seeking missiles. For such use, a number of such prepared sponges is loaded into the air-tight load compartment of a shell as illustrated in patent application Ser. No. 643,781. The loading is effected under argon or nitrogen, to keep the material from exposure to the oxygen of the air until the shell is fired. Wetting the prepared sponges with a little n-nonane before such loading, helps assure the sealing of the sponge impregnant from the air.

Any other combustible type of sponge such as polyvinyl chloride, cellulose or polystyrene, that when ignited burns for at least about 20 seconds, can be used. Cellulose nitrate sponges tend to burn up too rapidly.

The pyrophoric metal of the foregoing combinations can be replaced by a stabilized pyrophoric metal, as described in patent application Ser. No. 685,910, the contents of which are hereby incorporated herein as though fully set forth. The stabilizing is essentially an exposure at low temperatures to very low concentrations of oxygen that causes the pyrophoric surface to become filmed with a very thin layer of oxide without triggering the usual massive pyrophoric action. As a result, the pyrophoric surface loses its ability to spontaneously react with air, unless that surface is heated to about 100° C.

By substituting the stabilized iron powder for the unstabilized pyrophoric iron powder in the composition of Example 4, that composition becomes essentially inert to air at normal temperatures. However, when touched with a lighted matchstick it immediately ignites. After burning for a few seconds, it ignites a thermite mixture or disc as in FIG. 2. The stabilized pyrophoric iron or nickel has a slightly lower thermal output than the unstabilized materials, and so should be used in an igniter mixture in a concentration from about 17% to about 25% by weight.

Instead of ignition by a burning matchstick, the stabilized igniting composition can be heated in a hot air oven set at 100° C. Ignition will take place when the igniting composition heats up to about that temperature.

The stabilized igniting composition will also ignite when contained in a shell that is fired as described above. The firing causes hot propellant gas from the firing charge to heat up the stabilized composition sufficiently to ignite it. Such ignition will take place whether the igniting composition is or is not packed to air in the shell.

The stabilizing of pyrophoric powder produces a stabilized material that varies in its ignition temperature from about 70° C. to about 150° C. and any such composition can be used.

A lighted matchstick can also be used to ignite a composition like that of Example 4, but containing no pyrophoric iron or stabilized pyrophoric iron. Such a zirconium-based igniting powder will self-ignite when heated to about 500° C., and a lighted matchstick will so heat it up in a few seconds. Any other thermite-type oxidizing metal oxide such as cobalt oxide, nickel oxide, copper oxide and manganese oxide can be substituted for some or all of the iron oxide without loss of such ignitability. The match-ignited composition can be pelleted and can contain a binder, such as equal parts by weight of zirconium, $Fe_2O_3$ and the binder of Example 4. Such match-ignited compositions will, in turn, ignite thermite discs or pellets in the arrangement of FIG. 1. Such thermite ignition will also be obtained by similar impregnants, in which powdered titanium is substituted for the powdered zirconium, but such titanium-containing mixtures need a propane torch or the like to ignite them. They are not ignited by a burning matchstick. Only about half as much titanium as zirconium, by weight, is needed.

The ignition temperature of the zirconium powder can be reduced to about 350° C., by using zirconium that has been activated by being alloyed with aluminum and then has its aluminum content largely leached out with aqueous caustic, as described in patent Ser. No. 830,767.

The addition of boron to an igniting mixture causes it to generate more heat, whether the boron be added as a powder mechanically mixed with the remaining igniter ingredients, or alloyed with the pyrophoric metal. Up to about 25% by weight of such boron can be contained in the mixture, and at least about ½% is needed before its heat output increase becomes significant. A typical such composition is, by weight:

Example 6

10 parts pyrophoric iron powder
20 parts zirconium powder
15 parts boron powder
20 parts $Fe_2O_3$ powder all powders being about 325 mesh.

Boron makes an effective reducer for iron oxides and similar thermite-type metal oxides. However, when boron is the sole reducer used, the resulting thermal output is not as large as that of standard thermite mixtures. Thus, a mixture of 11 grams of $Fe_2O_3$ with 1.5 grams of boron powder can be pelleted and will be ignited by the above-described ignitors, but will not melt through a steel support.

Figure 2:
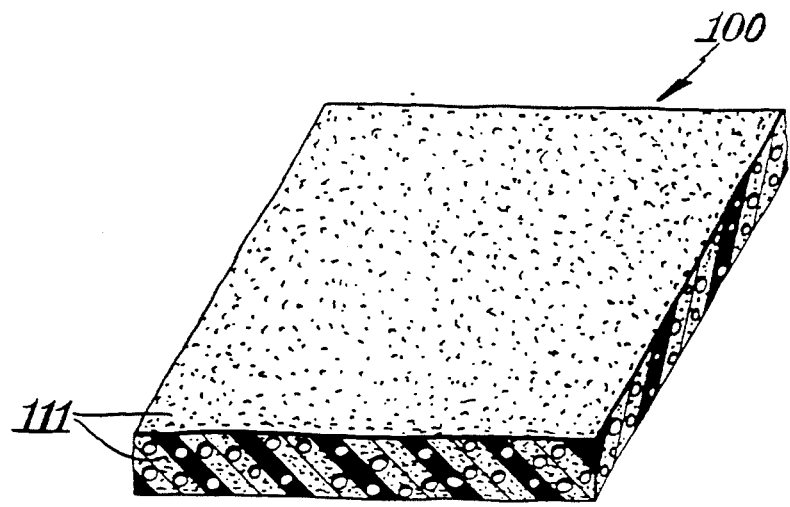
FIG. 2 illustrates a pyrophoric article of the present invention.

Also, when boron is the principal reducer in a mixture containing thermite-type metal oxide and pyrophoric igniters, such mixture burns so rapidly upon ignition that it will burn out without igniting a thermite-type disc as in FIG. 2. An example of such a rapid-burning mixture is a mixture of:

10 grams pyrophoric iron
3 grams boron
25 grams binder solution of Example 5
22 grams of $Fe_2O_3$ In general, thermite powders should not be over about 50 mesh in size. While pyrophoric metal powders can be as large as 20 or 30 mesh, it is preferred to have all the igniter particles of about the same size so as to reduce their tendency to segregate during handling. Where the igniting mixture is compacted or applied with a binder solution that is subsequently dried, no subsequent segregation is possible so that the separate ingredients of the mixture can vary from about one micron to about 300 microns in size.

When using pyrophoric foil for decoying heat-seeking missiles as described in patent applications, the foil can have one of its faces coated with a little thermite mixture. Thus, a 325-mesh zirconium-$Fe_2O_3$ mixture containing about 0.1 to about 0.3% binder can be deposited to a thickness up to about 2 mils as a layer on a pyrophoric iron or nickel foil which is about two to about ten mils thick, to increase the heat output. Such a coated foil also has its thermal radiation shifted to frequencies closer to that of a hot jet engine exhaust.

Powdered boron alone can be similarly coated in the foregoing amounts on such a pyrophoric iron or nickel foil, and will cause the foil to disintegrate after it has pyrophorically reacted. Such disintegration reduces the bulk remaining from a decoy deployment, and also reduces its radar visibility.

Slow-burning materials are also suitable for use without the thermite disc or pellet. Thus, pyrophoric articles are built up of a mass of pyrophoric particles that are combined with slow-burning combustible organic material including carbon. Thus, a pyrophoric member of the present invention can be in the form of a lightweight open-celled foam of combustible thermally insulating organic material, the foam being impregnated with at least twice its weight of a pyrophoric powder that is sufficiently pyrophoric to reach a temperature of at least about 500° F. after it is ignited by exposure to air. The combustible material can also be carbon fiber cloth.

The pyrophoric particles can be coated with a material like a vaporizable liquid or solid that delays the onset of the pyrophoric action after the coated material is exposed to air.

The pyrophoric powder is preferably iron or nickel powder, although any other pyrophoric powder, even pyrophoric titanium powder, can be used. By having pyrophoric powder in which the powder particles contain boron that may or may not be alloyed with the pyrophoric metal in the powder, remarkably good results can be obtained. Other readily ignited ingredients such as carbon, titanium or zirconium powders are also helpful. Alloys of any or all of the foregoing are useful.

FIG. 2 illustrates a pyrophoric article in the form of a small piece of open-celled foam or sponge 100. A cellulose sponge or open-celled polyvinyl-chloride, urea-formaldehyde, polyurethane, polypropylene or polystyrene foam is suitable. The cells in the sponge are loaded with pyrophoric particles 111 so that the particles constitute at least about two-thirds of the total weight of the loaded sponge.

Pyrophoric iron particles such as those described in Ser. No. 538,541 are very effective, and the contents of that application are hereby incorporated herein as though fully set forth herein. Pyrophoric iron particles containing 2 to 30% boron by weight of the iron are especially effective. Even a fraction of 1% boron helps the pyrophoric action.

When the sponge or foam is yieldable upon squeezing, it is conveniently loaded by submerging it in a dispersion of pyrophoric particles suspended in a liquid like water to make a mobile slurry. Thus the particles can be about 10 to about 100 microns in size slurried into twice their weight of water or acetone. A little binder, such as an acrylic resin can be dispersed or dissolved in the slurry to help hold the particles in the pores of the sponge or foam. About $\frac{1}{2}$ to about 10% of dry binder weight based on the total weight of the particles, is adequate. A 5% by weight solution of ethyl acrylate polymer in acetone does a very good job of providing the binder after the solvent is subsequently vaporized off. Freons such as unsymmetrical trichloro trifluoro ethane ($CFCl_2$—$CF_2Cl$) can also be used to dissolve suitable resin binders. Concentrated solutions or dispersions of binder, such as those containing more than 10% binder are undesirable inasmuch as after drying they will substantially completely block access of air to the pyrophoric surfaces.

The submerged sponge or foam can then be squeezed to expel most of the contents of its pores, after which it can be permitted to expand, still submerged, to draw the metal particles into its pores. The submerged squeezing and expansion can be repeated to help assure maximum particle pick-up. A total particle pick-up of at least about one-fifth the weight of the dry sponge or foam is desired, and about $2\frac{1}{2}$ to 10 or 15 times that dry weight is readily attainable.

When the squeezing and expansion is completed, the particle-loaded sponge or foam is withdrawn from the slurry and can be permitted to dry in an inert atmosphere such as under argon or nitrogen. After drying it can then be exposed to air to initiate pyrophoric action. Such action ignites the sponge or foam and burning continues for as much as several minutes. Very small sized cellulose sponge pieces, for example 4 mm on edge, will when loaded, pyrophorically burn for about 30 seconds or more, and even a very short pyrophoric action a very few seconds long is enough to ignite such combustible material or burn through paper. The combustible pieces are preferably sufficiently slow-burning to take at least 20 seconds to be completely consumed after they are ignited by the pyrophoric action. The presence of the sponge or foam around the pyrophoric particles extends the time spanned by the pyrophoric action. The sponge or foam can be as large as desired, but it can also be subdivided into pieces only about 3 to about 10 millimeters in maximum dimensions. A quantity of such small pieces can then be propelled into the air to furnish a hot cloud that takes some time settling out. For this purpose the filled pieces of sponge or foam should have a low density, about 0.01 to about 0.3 gram per cubic centimeter of bulk, and are preferably of leafy shape so they flutter rather than merely drop when discharged.

Other combustible materials such as cyanoacrylate or polyvinyl alcohol or nitrocellulose cements can also be used as binders to anchor the pyrophoric particles in place, and even non-combustible binders such as bentonite can be used although combustible binders are preferred. Too much binder of either kind can seal the pyrophoric particles against contact with the air, and so should be avoided. Omitting the binder completely permits some of the particles loaded into the sponge or foam to fall out on handling, particularly where those particles are over about 10 microns in size. Making them smaller in size can readily be accomplished as by grinding $FeAl_2$ or $FeAl_3$ or $NiAl_3$ particles to the desired fineness before they are leached with caustic to develop their pyrophoricity. These aluminides are quite brittle and grind down fairly easily.

Pyrophoric particles can also be kept from falling out of loaded thermoplastic sponges or foams, by softening or partially melting the sponges or foams to cause them to adhere to the particles. Thus a particle-loaded foam held in an inert atmosphere can be subjected to a very low frequency induction heating electric field to cause the metal particles to heat up and partially melt any foam surface they contact.

Sponges or foams of thermoplastic material such as polyethylene or polyvinyl chloride will begin to melt when metal particles loaded in them pyrophorically react. However, they are ignited by the pyrophorically generated heat as or shortly after they begin to melt so that their melting does not completely cover the particles and does not stop the pyrophoric action although it can slow that action somewhat.

Where the sponge or foam is not pliable so that it cannot be squeezed without becoming damaged, its open cells can be loaded with pyrophoric particles as by pouring a slurry of the particles through it to cause some of the particles to become trapped in place by a filtering action. Where the slurry particles are only slightly smaller than the pores through which the slurry is poured, this technique can provide a very acceptable loading. Such pouring can also be used to build up the loading in a sponge or foam that has been loaded by squeezing and expansion technique.

The pyrophoric particles can also be incorporated in the foam-forming compositions so that they are already in place when the foam formation is completed.

The pyrophoric action of a loaded sponge or foam can be stretched out in time by having the pyrophoric surfaces partially blocked against access to air. The above-mentioned binders have such an effect, as does the use of colloidal inert particles as described in U.S. Pat. No. 4,435,481. Thus a colloidal alumina or colloidal silica dispersion can be added to the slurry of pyrophorically activated metal particles so that after the particles are subsequently loaded and dried, the colloidal material dries in the surface pores of the pyrophoric particles and partially blocks those pores. The colloidal particles should be smaller than 0.1 micron in size, and are available commercially in predispersed condition. Only about 0.5% to 5% of the colloidal particles based on the weight of the pyrophoric particles, effects a measurable stretching out of the pyrophoric action, and such delay is further extended by the presence of a small amount of resin or other binder as disclosed in Ser. No. 281,405.

Any pyrophoric metal or mixtures of such metals can be used in the combinations of the present invention. Although platinum can be provided in the form of pyrophoric particles, it would be expensive for most pyrophoric uses. Iron is a preferred pyrophoric metal because of its low cost, but nickel, cobalt, titanium and copper can also be used and can be alloyed with each other or with other metals like lithium and calcium that increase their pyrophoricity. Alloying the pyrophoric metal with boron or carbon or phosphorus also increase the amount of heat generated by the pyrophoric action, but such ingredients should not total more than about 30 percent of the weight of the pyrophoric metal.

Lightweight pyrophoric article can also be made by adhering a layer of pyrophoric metal particles to an adhesively coated thin ribbon of foam or textile or carbon fiber cloth or even sliced corncob. Thus a 1 millimeter thick ribbon of open-celled nylon (polyamide) or polyester foam or corncob slice can have one of its surfaces coated with a pressure-sensitive adhesive and a layer of pyrophoric nickel powder adhered to that surface. A single such powder layer in which the powder particles are about ½ to about 1 millimeter in size is very effective, but smaller and larger sized particles can also be used, and will produce a hot cloud of long duration when ejected into the air in small pieces. Very finely divided pyrophoric particles will penetrate into the pores of the ribbon support or of porous carbon fiber cloth or other cloth, and need little or no adhesive layer on the support. However, a binder can be used as noted above, to help retain the pyrophoric particles in the pores of the substrate.

If desired the margins of the ribbon can have their surfaces free of particles, so that the ribbon can be folded against itself or cemented against another ribbon, to enclose the adhered pyrophoric particles.

Paper can be substituted for the foam or corncob ribbon to give corresponding results. Where the paper ribbon totally encloses the the pyrophoric particles, the paper should be made of porous stock, as used in vacuum cleaner bags, for example.

The pyrophoric particles of the present invention can be provided as in the patent applications or by chopping up pyrophorically activated metal foils. Such foils can have one or both faces laminated to pressure-sensitive tapes as described in U.S. Pat. No. 4,435,481. By making such pressure-sensitive tapes of low-density foam, the density of the chopped-up pieces can be made as small as desired to provide the slowly-settling hot cloud of the present invention.

The pyrophoric members of the present invention can be stored under argon or nitrogen or other inert atmosphere, in the shell of a flare pistol or that of U.S. Pat. No. 4,404,912 for example, so that they can be expelled and projected by the firing of the shell to form the desired hot cloud. Alternatively they can be packed in a frangible container along with a small amount of explosive and a contact detonator or a timed detonator as in a hand grenade, sufficient only to burst open the container and expel the packed members. By packing the members under super-atmospheric pressure, the quantity of explosive needed can be reduced.

Where the pyrophoric members are in the form of particle-filled foam sufficiently resilient, the members can be packed in compressed condition so that they occupy less space in packed condition but quickly expand when expelled.

Volatile liquids like halogenated ethane or methane, or highly fluorinated $C_3$ to $C_8$ hydrocarbons, or acetone, water, or mixtures of acetone and water, can be used to supply the protecting covering for the pyrophoric members, in place of or in addition to an inert gas. Such liquids can take as little as about two to five seconds and as much as about ten minutes to volatilize away sufficiently to permit the pyrophoric action to commence. Liquids that do not dissolve much of whatever binder is helping to hold the particles in or on their support, are preferred. Thus cross-linked or thermoset binders and even some acrylic binders, are not particularly dissolved by hydrocarbons or fluorinated hydrocarbons. Mixtures of the delay-producing liquids will vary the delay times. Thus diluting a perfluorinated $C_7$ to $C_8$ hydrocarbon with half its weight of a trifluoro-trichloro ethane will provide delays of about five minutes, while dilution with an equal weight will provide about ½ minutes delays. Very long delays can be obtained by projecting a mixture of the pyrophoric particles with the unfoamed or slightly foamed foam-forming composition, so that foam formation takes place after the projection and the pyrophoric action does not start until after the foam formation has progressed far enough to expose some of the particles.

Different batches of pyrophoric materials can be prepared to have different delay times, and can be combined in one discharge shell or other projecting arrangement, so that upon projection some pyrophoric action will commence immediately, some a few seconds later, some ½ minutes later etc. This provides a very useful modification.

The same type of modification can be made with pyrophoric foils that are projected with or without combustible foam or sheets. A feature of the use of such pyrophoric foils as in the patent applications, is that the amount of delay-inducing covering liquid is readily controlled. Thus 1010 iron foils activated on both faces and 2.5 to 3 mils thick can be carefully dried under argon, then momentarily dipped in perfluorinated $C_7$ to C$_8$ hydrocarbon and finally blotted free of visible liquid. These blotted foils appear to the naked eye to be free of liquid, but on weighing show a liquid pick-up at about 2.9 milligrams per square centimeter of total foil surface. Upon projection into the air there is a delay of about 50 seconds before pyrophoric action starts. Similar delays are provided by hydrocarbon liquids having comparable volatilities. Where such liquid-carrying foils are packed in a container having free space, it is helpful to have some of that liquid or its vapor packed in that space to keep the delaying effect from dissipating.

Such delay-treated foils can be packed in a flare shell or the like, either alone or along with other foils having less or no delay, and in such combined packing it is better have each batch of delayed foils separated from the other batches of differently delayed foils, to assure that there is little or no migration of delaying liquid between batches.

Readily volatilized solids such as chloral hydrate can also be used to coat the members for delaying the onset of pyrophoric action.

The heat output of the members of the present invention is particularly desirable. The pyrophoric phase of the output plus the combustion phase that follows, gives an overall output that effectively spans a wide spectral range as well as a very long time. Some foams and porous sheets burn with different spectra, and can be further modified as by introduction of one or more nitro groups to further vary the combustion. Thus a cellulose mononitrate sponge burns more rapidly than a sponge made of cellulose that is not nitrated.

Figure 3:
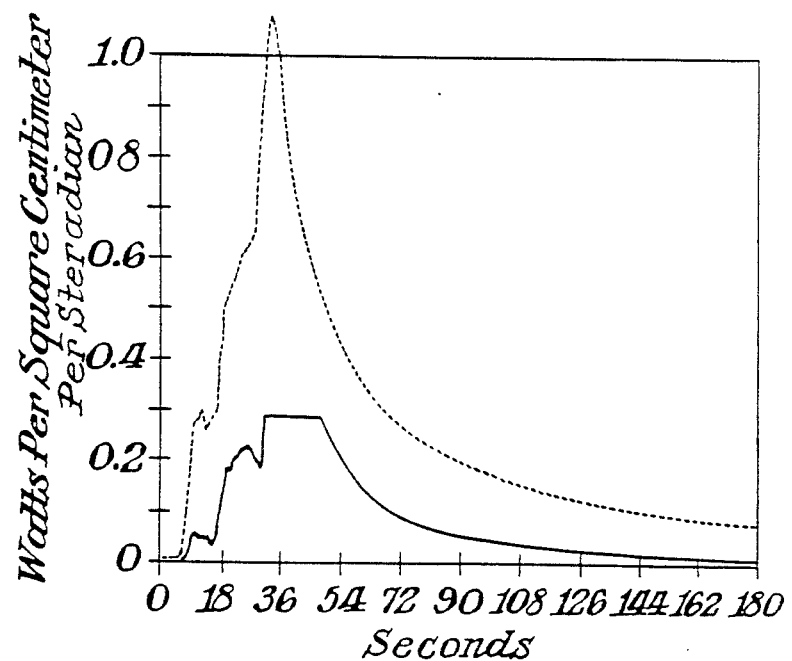
FIGS. 3, 4 and 5 show typical heat output curves for such article.

FIG. 3 shows the energy output versus time, of a 1 inch by 3 inch by ½ inch polyurethane or polyvinyl chloride sponge loaded with 7 times its weight of pyrophoric iron particles averaging about 10 microns in size, held by an acrylic binder weighing about 1% of the weight of the loaded sponge. The dotted line represents the energy emitted in the 3 to 5 micron infra-red wave lengths, and the full line, the energy emitted in the 2 to 3 micron range. The time measurement starts when the filled sponge is first exposed to the air. The energy is measured with radiometers sensitive to the designated ranges and with the gross sponge dimensions shown by a ruler. It will be noted that the heat dwell is at least three minutes long. To simulate the falling of the sponge through air, a stream of air at 6 feet per second is directed at the sponge during the entire measurement. The iron particles contained 6 to 7% boron and the loaded sponge weighed between about 0.15 and 0.25 grams per cubic centimeter.

Figure 4:
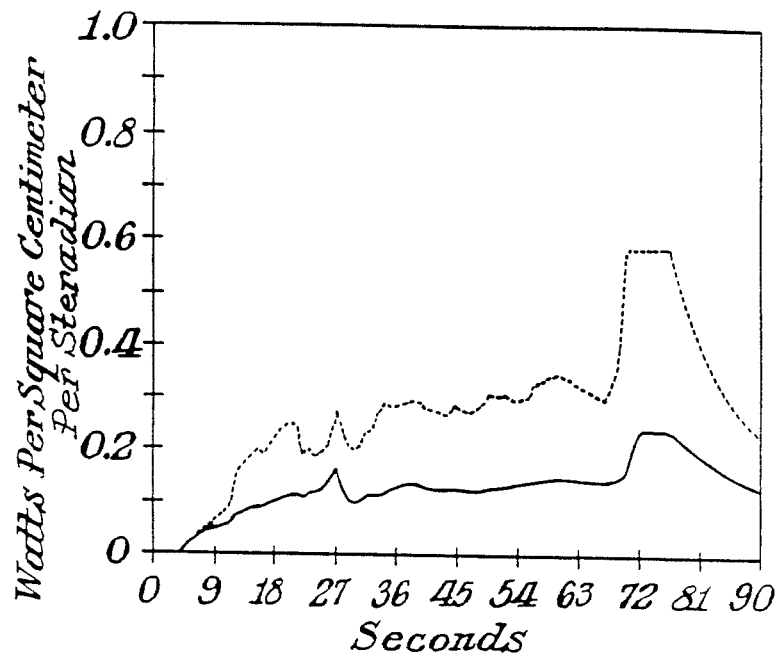

FIG. 4 is a similar representation of the energy output of a loaded sponge as in FIG. 3, but with no air stream directed at it. Here the dotted line is the energy output for the 3 to 5 micron range, and the full line that for the 8 to 14 micron range. After 1½ minutes, the energy output is still greater than the corresponding output in FIG. 3.

Figure 5:
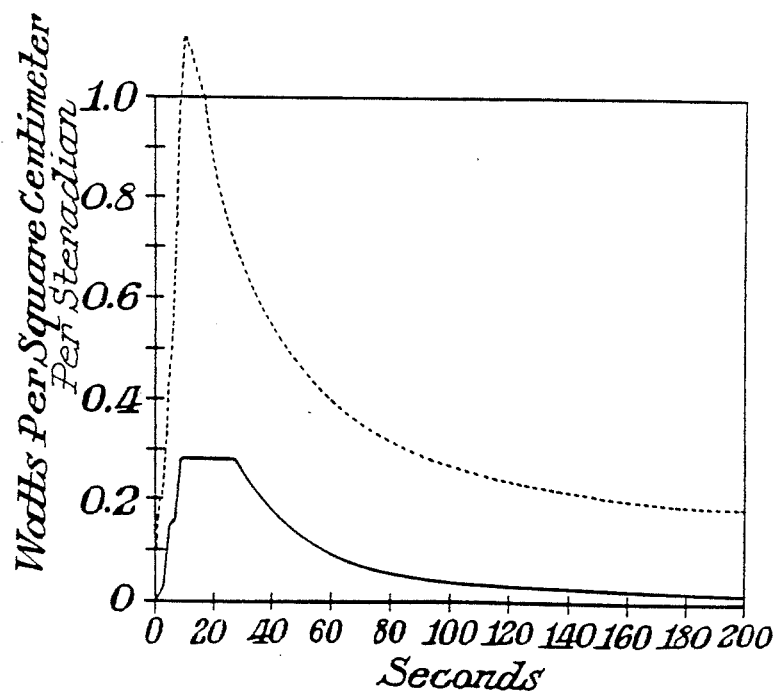

FIG. 5 is another energy output measurement of a sponge twice as thick as the sponge of FIG. 3, but impregnated with as much trichloro trifluoro ethane as it will hold. Upon exposure to the stream of air, there was a long delay during which the impregnant evaporated off, and after about 100 seconds pyrophoric action became evident. The energy output measurement was begun 110 seconds after initial exposure, and as shown then continued for a further 200 seconds.

It should be noted that the flat-top plateaus in the energy output curves were the results of limits on the measuring equipment when those measurements were being made. Without those limits, the flat tops would have been replaced by peaks as in the other curves.

Extremely good energy emission is also obtained from porous carbon fiber cloth loaded with 20% by weight of the foregoing boronized and binder-retained iron particles. Thus even without the lead acetate coating used to promote ignition of such fibers, overall ignition of 12 mil thick and 25 mil thick cloth each woven from 4 to 5 mil thick fibers, takes place readily with or without delay as desired. Whether or not the fibers are activated as by a pitting action effected by decarburizing in wet carbon monoxide to give a larger value of surface area per gram, about the same energy is emitted in accordance with the present invention.

The Raney type activated iron and nickel are specially desirable for the present invention inasmuch as they are intensely pyrophoric and relatively inexpensive, particularly the iron. Thus a carbon fiber cloth is difficult or impossible to ignite with other pyrophoric particles, even when the carbon fibers are pitted and coated with a lead acetate film. Alloying the iron or nickel with up to about 20 percent boron or carbon by weight further intensifies their pyrophoric action, and such intensification can also be obtained by mixing oxidizer particles such as potassium nitrate or chlorate with the pyrophoric particles or by coating the oxidizer on the substrate to be ignited. Intensification of the action also speeds it up so that it is completed sooner.

The radiation characteristics of a burning carbon fiber web are also improved by coating it with borosilicate or borochromate particles in which the boron oxide content is from about 5% to about 50%.

About a 1/10 to 15-mil thick layer of pyrex glass particles ground to about 200 mesh and adhered to one face of a 5 to 30-mil thick carbon fiber cloth, provides a radiation pattern particularly desirable for decoying heat-seeking missiles. A little binder solution such as that used in connection with FIG. 1 can be used to secure such coating in place, so that all that is needed is to spray on the binder solution containing the powdered glass particles suspended in it, and then permitting the sprayed-on coating to dry.

The sizes of the individual glass particles should be from about 10 to about 100 microns.

A further improvement in the foregoing radiation characteristics is obtained when a layer of aluminum particles is interposed between the powdered glass coating and the carbon fiber cloth. Such aluminum layer can be from about 1/10 to about 1-mil thick, can consist of aluminum particles also about 10 to about 100 microns in size, and can be applied the same way described above for the glass particles. Drying of the binder-containing aluminum particle layer permits the spraying over it of the glass particle layer without excessive smearing of the aluminum particles. Aluminum alloys containing at least about 80% aluminum can be used in place of pure aluminum.

A very effective coated and self-igniting carbon fiber cloth is prepared by starting with a 16-mil thick cloth that is activated by pitting and coating with lead acetate in accordance with the prior art. On one face, there is applied a ½-mil thick layer of aluminized particles, which is dried and followed by a 11.5-mil thick layer of particles of the following glass composition, by weight:

|     |       |
| --- | ----- |
| 72% | SiO$_2$ |
| 25% | B$_2$O$_3$ |
| 0.5% | Na$_2$O |
| 1% | Al$_2$O$_3$ |
| 1% | K$_2$O |
| 0.5% | Li$_2$O |

The resulting material is dried again and is now placed in an argon box. While in an argon atmosphere the uncoated cloth face is sprayed with a 16.5-mil thick layer of 325 mesh pyrophoric iron particles, dried and the pyrophoric layer then top-coated with a 0.5-mil thick layer of the same glass particles previously applied. Another drying step, still under argon, completes the product. When that completed product is exposed to air, its pyrophoric coating promptly ignites and then ignites the carbon fibers of the cloth. The entire cloth burns away and in doing so very effective radiation is generated.

The last borosilicate layer can be omitted without seriously detracting from the radiation effectiveness.

Another borosilicate that can be used is a simple pyrex formulation of:

|       |       |
| ----- | ----- |
| 80.6% | SiO$_2$ |
| 13.8% | B$_2$O$_3$ |
| 4.0% | Na$_2$O |
| 1.6% | Al$_2$O$_3$ and Cr$_2$O$_3$ |

Simple mixtures of B$_2$O$_3$ and SiO$_2$, as well as of B$_2$O$_3$ and Cr$_2$O$_3$ are also effective, but are not as effective unless sintered or fused together.

Melt alloying iron with sufficient aluminum to make an aluminide ranging from FeAl$_2$ to FeAl$_3$ and with 5 to 20 percent of boron by weight of the iron, provides a product that can be ground and readily leached of sufficient of its aluminum to give very good pyrophoricity. A correspondingly made nickel alloy is similarly suited.

The pyrophoric particles or the porous members carrying such particles are effective solid fuels that can be injected into turbine engines to burn and thus operate such engines. For this purpose the particles and the porous members should be very finely divided so that they burn rapidly. In order to simplify the storage of the particles, their surfaces can be coated or impregnated to prevent pyrophoric action until after the particles are injected into the engines intake where the elevated temperatures normally at the intake will then cause the particles to ignite.

Thus the particles can be dipped in liquid perfluoroalkane having a boiling point of 215° F., then removed from the liquid and dried by rolling them over paper towels, or blowing argon over them, until they appear to be free of surface liquid. Notwithstanding that appearance, the particles do not spontaneously ignite when merely exposed to air, even upon ten days exposure to air.

However when exposed to air and heated to about 150° C. they promptly ignite and then go through a complete combustion. At this ignition temperature it appears that residual liquid in the porous surface of the particles is driven off to permit the pyrophoric action.

Similar results are obtained with hydrocarbons or other relatively inert liquids that have boiling points of at least about 200° C. Paraffin wax also behaves similarly but requires a temperature of at least about 250° C. to be ignited. Pyrophoric iron or other metal powders so treated make particularly desirable solid fuels for turbine engines which have compressor sections that operate at temperatures sufficiently high to effect the foregoing ignition. Such metals can be relatively soft so that they do not excessively erode the engine as they move through it. Alloying boron or carbon or both with these metals increases their hardness but gives less erosive combustion products. It is accordingly preferred to add carbon as finely divided graphite particles, or as graphite coatings on the pyrophoric particles.

For engines in which the intake temperature is at least as high as 300° C., pyrophoric action is so markedly accentuated that more than 30 weight percent boron can be alloyed with iron or nickel that is subsequently pyrophorically activated, without swamping out the pyrophoricity. The boron content can be increased to about 50 to 60 weight percent for still higher intake temperatures. It is preferred to have no more than about 70% boron in such an alloy inasmuch as at higher concentrations the boron burns to a sticky liquid boron oxide that coats the surfaces of the burning particles and seriously hinders or prevents further combustion.

Obviously many modifications and variations of the present invention are possible in light of the above teachings. It is therefore to be understood that within the scope of the appended claims the invention may be practiced otherwise than as specifically described.

I claim:

1. A thermite-type mixture of powdered oxide oxidizer and powdered metal reducer that interact when ignited to generate very large quantities of heat, the mixture being in thermal contact with a truly pyrophoric material which when exposed to air, pyrophorically reacts with oxygen and generates sufficient heat for a sufficiently long time to ignite the thermite-type mixture, the combination being housed out of contact with oxygen.

2. The combination of claim 1 in which the pyrophoric material is a powder in physical contact with the thermite-type mixture and with a combustible material that burns for at least about 20 seconds when ignited.

3. The combination of claim 2 in which the pyrophoric powder is impregnated into the pores of an open-celled body of combustible plastic foam and the thermite-type powder is a compressed mass within a pocket in the foam body.

4. A thermite-type composition containing powdered metal oxide oxidizer and powdered metal reducer that interact with each other when the composition is ignited, the composition also containing about 17% to about 30% of an igniting powder that exothermically reacts with air after being heated to about 100° C. to 350° C.

5. The combination of claim 4 in which the igniting powder has as its igniting control a metal powder perpared by stabilizing a pyrophoric metal.

6. The combination of claim 4 in which the igniting powder is an activated zirconium.

7. A pyrophoric lightweight porous slow-burning carbon fiber web impregnated with at least one-fifth its weight of pyrophoric iron or nickel powder that is sufficiently pyrophoric to ignite and burn up the web when the impregnated web is exposed to air.

8. A porous foam of slow-burning organic material impregnated with at least one-fifth its weight of a pyrophoric powder sufficiently pyrophoric to ignite and burn up the foam when the impregnated foam is exposed to air.

9. The combination of claim 8 in which the pyrophoric powder is pyrophoric iron or nickel powder.

10. The combination of claim 8 in which the pyrophoric powder is a pyrophoric iron that had been alloyed with more than 2% boron.

11. The combination of claim 14 in which the pyrophoric powder is a pyrophoric iron that had been alloyed with more than 2% boron.

12. A porous combustible plastic foam impregnated with sufficient pyrophoric powder that ignites the foam and causes it to burn when the impregnated foam is exposed to air, the impregnated foam having a density between about 0.01 and about 0.3 gram per cubic centimeter of bulk.

13. A pyrophoric member having pyrophoric metal particles held by a porous combustible support that does not seal the particles from exposure to air and becomes ignited by the pyrophoric action of the metal particles when the member is exposed to air, the particles carrying a coating that delays for at least ten seconds and up to about ten minutes the on-set of the pyrophoric action after said exposure to air.

14. A pyrophoric lightweight porous slow-burning web of a material selected from the class consisting of carbon fiber fabric and combustible resin foam, the web being impregnated with at least one-fifth its weight of pyrophoric powder that is sufficiently pyrophoric to ignite and burn up the web when the impregnated web is exposed to air.

15. The combination of claim 7 in which the carbon fiber of the carbon fiber web is activated fiber.

16. The combination of claim 15 in which the carbon fiber is pitted and coated with lead acetate.

* * * * *